US009349541B2

(12) United States Patent
Kim et al.

(10) Patent No.: US 9,349,541 B2
(45) Date of Patent: May 24, 2016

(54) METHOD FOR PRODUCING THREE-DIMENSIONAL MESOPOROUS TITANIUM DIOXIDE ELECTRODE USING ORGANIC/INORGANIC HYBRID SUPPORT AND DYE-SENSITIZED SOLAR CELL USING THE SAME

(71) Applicants: Jong-Hak Kim, Seoul (KR); Jung-Tae Park, Seoul (KR); Harim Jeon, Busan (KR); Sang Jin Kim, Seoul (KR)

(72) Inventors: Jong-Hak Kim, Seoul (KR); Jung-Tae Park, Seoul (KR); Harim Jeon, Busan (KR); Sang Jin Kim, Seoul (KR)

(73) Assignee: INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 0 days.

(21) Appl. No.: 14/239,421

(22) PCT Filed: Dec. 18, 2012

(86) PCT No.: PCT/KR2012/011064
§ 371 (c)(1),
(2) Date: Feb. 18, 2014

(87) PCT Pub. No.: WO2013/122316
PCT Pub. Date: Aug. 22, 2013

(65) Prior Publication Data

US 2014/0345676 A1 Nov. 27, 2014

(30) Foreign Application Priority Data

Feb. 15, 2012 (KR) ........................ 10-2012-0015406

(51) Int. Cl.
*C01G 23/047* (2006.01)
*H01G 9/20* (2006.01)

(Continued)

(52) U.S. Cl.
CPC .............. *H01G 9/2031* (2013.01); *H01L 31/18* (2013.01); *C01G 23/047* (2013.01);
(Continued)

(58) Field of Classification Search
CPC ............................. C01G 23/04; C01G 23/047
USPC ................................................. 423/608–616
See application file for complete search history.

(56) References Cited

U.S. PATENT DOCUMENTS

2008/0185037 A1 8/2008 Kim et al.

FOREIGN PATENT DOCUMENTS

KR 1020120001936 1/2012

OTHER PUBLICATIONS

Chiatzun Goh, Nanostructuring titania by enbossing with polymer molds made from anodic alumina templates, 2005, Nano Letters, vol. 5 No. 8, 1545-1549.*

(Continued)

*Primary Examiner* — Matthew E Hoban
*Assistant Examiner* — James Fiorito
(74) *Attorney, Agent, or Firm* — Duane Morris LLP; J. Rodman Steele, Jr.; Gregory M. Lefkowitz

(57) ABSTRACT

Disclosed is a method for producing a mesoporous titanium dioxide thin film from a titanium precursor by using a polymer-grafted alumina composite as a support. The porous titanium dioxide thin film is obtained by using the polymer-grafted hybrid alumina composite as a support for sol-gel reaction, and thus it has a mesoporous structure and high surface area, thereby providing a high dye adsorption ratio. Therefore, a dye-sensitized solar cell using the mesoporous titanium dioxide thin film as a photoelectrode material has high energy conversion efficiency. In addition, it is possible to improve the long-term stability of a dye-sensitized solar cell through efficient infiltration of high-viscosity polymer and solid electrolyte as well as liquid electrolyte.

12 Claims, 6 Drawing Sheets

POLYMER–ALUMINA GRAFTING

TITANIUM PRECURSOR/WATER /HYDROCHLORIC ACID + POLYMER–GRAFTED ALUMINA/SOLVENT

DROP CASTING/HIGH–TEMPERATURE SINTERING

SELECTIVE REMOVAL OF ALUMINA IN STRONG ACID/BASE

MESOPOROUS TITANIUM DIOXIDE

(51) Int. Cl.
*H01L 31/18* (2006.01)
*C01G 23/053* (2006.01)

(52) U.S. Cl.
CPC ........ *C01G 23/0536* (2013.01); *C01P 2002/72* (2013.01); *C01P 2004/03* (2013.01); *C01P 2004/64* (2013.01); *C01P 2006/12* (2013.01); *Y02E 10/542* (2013.01)

(56) References Cited

OTHER PUBLICATIONS

KR 1020120001936 (Cited in IDS of Feb. 18, 2014) Machine Translation.*

Jiu, Jin Ting, et al., "Performance of dye-sensitized solar cell based on nanocrystals TiO2 film prepared with mixed template method," Solar Energy Materials & Solar Cell, May 2005, vol. 87, issues 1-4, pp. 77-86.

Koh, Joo Hwan, et al., "Templated synthesis of porous TiO2 thin films amphiphilic graft copolymer and their use in dy-sensitized solar cells." Thin Solid Films, Oct. 29, 2010, vol. 59, issue 1, pp. 158-163.

Zukalova, et al., "Organized Mesoporous TiO2 Films Exhibiting Greatly Enhanced Performance in Dye-Sensitized Solar Cells," Nano Letters, 2005, vol. 5, No. 9, pp. 1789-1792.

O'Regan, et al., "A low-cost, high-efficiency solar cell based on dye-sensitized colloidal TiO2 films," Lettters to Nature, vol. 353, Oct. 24, 1991, pp. 737-740.

Schindler, et al., "Charge-Carrier Dynamics in TiO2 Powders," J. Phys. Chem., 1990, vol. 94, pp. 8222-8226.

Borgarello, et al., "Sustained Water Cleavage by Visible Light," J. Am. Chem. Soc., 1981, vol. 103, pp. 6324-6329.

Docampo, et al., "Control of Solid-State Dye-Sensitized Solar Cell Performance by Block-Copolymer-Directed TiO2 Synthesis," Advanced Functional Materials, 2010, vol. 20, pp. 1787-1796.

* cited by examiner

METHOD FOR PRODUCING THREE-DIMENSIONAL MESOPOROUS TITANIUM DIOXIDE ELECTRODE USING ORGANIC/INORGANIC HYBRID SUPPORT AND DYE-SENSITIZED SOLAR CELL USING THE SAME

CROSS-REFERENCE TO RELATED APPLICATIONS

This application is a §371 national stage entry of International Application No. PCT/KR2012/011064, filed Dec. 18, 2012, which claims priority to South Korean Patent Application No. 10-2012-0015406 filed Feb. 15, 2012, the entire contents of which are incorporated herein by reference.

TECHNICAL FIELD

The present disclosure relates to a method for producing a three-dimensional mesoporous titanium dioxide electrode using an organic/inorganic hybrid support and a dye-sensitized solar cell using the same.

BACKGROUND ART

Currently, petroleum is used as a main energy source. However, serious problems occur due to emission of air pollutants and global warming caused by a so-called greenhouse effect. To regulate emission of carbon dioxide, a main cause of global warming, The Kyoto Protocol was adopted in 1997 and came into effect in Feb. 16, 2005. Korea has been included in countries under regulation since 2013. Therefore, it is necessary to diversify energy supply sources. There is an imminent need to develop renewable energy sources such as solar energy, wind power and water power that substitute for petroleum energy.

Solar cells are classified, depending on their constituents, into those including inorganic materials such as silicon compound semiconductors and sensitive dye molecules. When the particle size is excessively small (<several nanometers), dye adsorption increases. On the contrary, in this case, the number of surface states increases to provide recombination sites undesirably. Therefore, it is a key solution in dye-sensitized solar cells to control the particle size, shape, crystallinity, microstructure and surface characteristics of oxide.

The oxides that have been studied to date include $TiO_2$, $SnO_2$, ZnO, $Nb_2O_5$, or the like. Among such oxides, it is known that $TiO_2$ (titania) is the material having the highest efficiency. Three phases of $TiO_2$ are known: brookite phase stable at room temperature, anatase phase and rutile phase stable at high temperature. The crystal structure of rutile phase has lower adsorbability to reactants as compared to the crystal structure of anatase phase [J. Phys. Chem., 94, (1990) 8222], shows a low rate of recombination of electrons with holes generated by light, and thus provides low activity as a photocatalyst as compared to anatase [J. Am. Chem. Soc., 103 (1981) 6324; J. Chem., 14 (1990) 265]. Therefore, it is preferred that titania as oxide maintains the crystal phase of anatase in the phtoelectrode of a dye-sensitized solar cell.

A mesoporous titanium dioxide thin film structure using an amphiphilic polymer as a support according to the related art has a large surface area on which a dye can be adsorbed, an interconnected structure that allows effective electron transfer, and a mesoporous structure that helps infiltration of a solid-state electrolyte having a relatively high molecular weight. However, such a mesoporous titanium dioxide thin film structure according to the related art is disadvantageous in that it does not have a thickness of several micrometers suitable for an effective dye-sensitized solar cell and high mechanical strength.

Recently, a so-called layer-by-layer approach and titanium dioxide monolith approach have been studied and reported in the art in order to provide a mesoporous titanium dioxide film with a thickness of several micrometers suitable for a dye-sensitized solar cell (Zukalova, Zukal et al., Nano Lett., Vol. 5, 1789, 2005; Docampo et al., Adv. Func. Mat., Vol. 20, 1787, 2010). However, the mesoporous titanium dioxide films obtained by the above-mentioned methods have a weak connection structure to a conductive substrate, and thus are disadvantageous in that they cannot provide high mechanical strength that is an important factor required for a dye-sensitized solar cell.

DISCLOSURE

Technical Problem

A technical problem to be solved by the present disclosure is to provide a method for producing a titanium dioxide thin film useful as a photoelectrode material for a dye-sensitized solar cell, wherein the titanium dioxide thin film has a high surface area, allows easy electron transfer, shows a mesoporous structure facilitating infiltration of electrolyte, and provides improved coherence to a substrate and mechanical strength of a thin film.

Another technical problem to be solved by the present disclosure is to provide a mesoporous titanium dioxide thin film obtained by the method, and a photoelectrode for a dye-sensitized solar cell including the same.

Technical Solution

In one general aspect, there is provided a method for producing a mesoporous titanium dioxide thin film, including the steps of:

(a) dispersing a polymer-grafted hybrid alumina composite into a solvent to provide a support solution;

(b) introducing a titanium precursor into an acidic solution, followed by agitation, to form a sol solution, and mixing the sol solution with the support solution to provide a sol-like mixed solution;

(c) drop casting the mixed solution, followed by sintering at high temperature to form an alumina/titanium dioxide composite thin film; and (d) removing alumina selectively from the composite thin film under a strongly acidic or strongly basic condition.

According to an embodiment, the polymer of step (a) may be selected from poly(oxyethylene)methacrylate, poly(ethylene glycol) methyl ether (meth)acrylate, hydroxyethyl (meth) acrylate, hydrolyzed t-butyl (meth)acrylate, acrylamide, N-vinylpyrrolidone, aminostyrene, styrenesulfonic acid, methylpropenesulfonic acid, sulfopropyl (meth)acrylate, sulfoethyl (meth)acrylate and sulfobutyl (meth)acrylate.

According to another embodiment, the composite of step (a) may have a weight ratio of 1:0.3-5 of alumina:polymer.

According to still another embodiment, the solvent of step (a) may be selected from tetrahydrofuran, N-methylpyrrolidone, dimethyl formaldehyde, dimethylsufoxide, alcohols and mixtures thereof.

According to still another embodiment, the titanium precursor of step (b) may be selected from titanium-(n)butoxide, titanium-(n)ethoxide, titanium-(n)isopropoxide, titanium-(n) propoxide and $TiCl_4$.

According to still another embodiment, the acidic solution of step (b) may be a mixture of water with hydrochloric acid containing 1-4 parts by weight of hydrochloric acid and 1-4 parts by weight of water based on 1 part by weight of the titanium precursor.

According to still another embodiment, in step (b), the support solution and the sol solution containing the titanium precursor may have a molar ratio of 1:1-10.

According to still another embodiment, in step (d), alumina may be removed selectively by dipping the composite thin film into an acid or base solution containing 5-30 parts by weight of acid or base and 5-100 parts by weight of solvent based on 1 part by weight of the composite thin film of alumina with titanium dioxide.

According to still another embodiment, the acid may be at least one selected from hydrochloric acid (HCl), hydrobromic acid (HBr), hydroiodic acid (HI), hypochlorous acid (HClO), chlorous acid ($HClO_2$), chloric acid ($HClO_3$), perchloric acid ($HClO_4$), sulfuric acid ($H_2SO_4$), fluorosulfuric acid ($HSO_3F$), nitric acid ($HNO_3$), phosphoric acid ($H_3PO_4$), fluoroantimonic acid ($HSbF_6$), fluoroboric acid ($HBF_4$), hexafluorophosphoric acid ($HPF_6$), chromic acid ($H_2CrO_4$) and boric acid ($H_3BO_3$).

According to still another embodiment, the base may be at least one selected from the group consisting of potassium hydroxide (KOH), barium hydroxide ($Ba(OH)_2$), cesium hydroxide (CsOH), sodium hydroxide (NaOH), strontium hydroxide ($Sr(OH)_2$), calcium hydroxide ($Ca(OH)_2$), magnesium hydroxide ($Mg(OH)_2$), lithium hydroxide (LiOH) and rubidium hydroxide (RbOH).

According to still another embodiment, step (c) may be carried out by sintering at 400-500° C. for 1-3 hours.

According to yet another embodiment, in step (d), alumina may be removed selectively by dipping the composite thin film into the acid or base solution at 20-80° C. for 1-24 hours.

In another general aspect, there are provided a mesoporous titanium dioxide thin film having an average pore size of 10-50 nm and a BET surface area of 70-100 $m^2/g$, and a photoelectrode for a dye-sensitized solar cell including the same.

Advantageous Effects

The porous titanium dioxide thin film according to the present disclosure is obtained by using a polymer-grafted hybrid alumina composite as a support for sol-gel reaction and has a mesoporous structure, so that it shows a high dye adsorption ratio. In addition, a dye-sensitized solar cell using the titanium dioxide thin film as a material for photoelectrode provides high energy conversion efficiency. Further, the titanium dioxide thin film allows efficient infiltration of high-viscosity polymer and solid electrolyte as well as liquid electrolyte, and thus improves the long-term stability of a dye-sensitized solar cell.

BEST MODE

Figure 1:
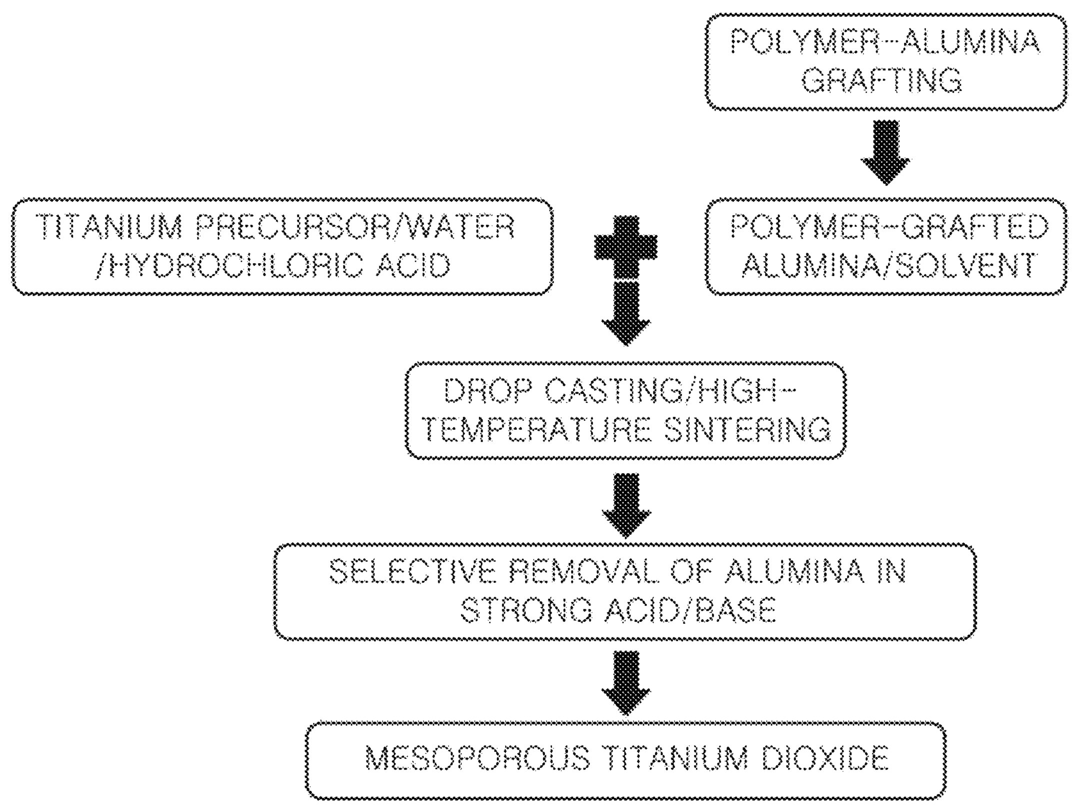
FIG. 1 is a flow chart illustrating the process for producing a high-surface area mesoporous titanium dioxide thin film by using a polymer-grafted alumina composite as a support for sol-gel reaction.

The present disclosure now will be described in more detail hereinafter.

The present disclosure relates to a method for producing a mesoporous titanium dioxide thin film from a titanium precursor by using a polymer-grafted alumina composite as a support, the method including the steps of:

(a) dispersing a polymer-grafted hybrid alumina composite into a solvent to provide a support solution;

(b) introducing a titanium precursor into an acidic solution, followed by agitation, to form a sol solution, and mixing the sol solution with the support solution to provide a sol-like mixed solution;

(c) drop casting the mixed solution, followed by sintering at high temperature to form an alumina/titanium dioxide composite thin film; and (d) removing alumina selectively from the composite thin film under a strongly acidic or strongly basic condition.

The polymer in the polymer-grafted alumina composite may be selected from poly(oxyethylene)methacrylate, poly-ethylene glycol) methyl ether (meth)acrylate, hydroxyethyl (meth)acrylate, hydrolyzed t-butyl (meth)acrylate, acrylamide, N-vinylpyrrolidone, aminostyrene, styrenesulfonic acid, methylpropenesulfonic acid, sulfopropyl (meth)acrylate, sulfoethyl (meth)acrylate and sulfobutyl (meth)acrylate. However, the scope of the present disclosure is not limited thereto.

The method according to the present disclosure may further include, before step (a), the step of preparing a polymer-grafted hybrid alumina composite. During the step of preparing a polymer-grafted hybrid alumina composite, it is possible to control the mesoporous characteristics of the finally formed titanium dioxide thin film by varying the size and crosslinking ratio of alumina nanoparticles.

The polymer-grafted alumina composite is prepared by an ATRP (Atomic Transfer Radical Polymerization) process using the polymer and alumina nanoparticles. During the preparation, it is possible to control the mesopore size and surface characteristics of the finally formed titanium dioxide by controlling the size of alumina nanoparticles.

In addition, the polymer-grafted alumina composite according to the present disclosure includes a polymer on which sol-gel reaction occurs actively. Thus, use of such a polymer as a template allows expansion of the reaction area of sol-gel reaction, thereby providing a titanium dioxide structure having a large surface area and a three-dimensional mesoporous structure.

According to an embodiment of the present disclosure, desired characteristics of a polymer-grafted hybrid alumina composite are realized when to the weight ratio of alumina: polymer is 1:0.3-5 in the polymer-grafted hybrid alumina composite.

Then, the polymer-grafted hybrid alumina composite is dispersed into an adequate solvent. In a separator container, a titanium precursor is dissolved into a solvent containing a small amount of $H_2O$/HCl added thereto. The two solutions are mixed with each other, subjected to drop casting, and sintered at high temperature to form an alumina/titanium dioxide composite thin film.

The solvent that may be used herein include, but is not limited to distilled water, tetrahydrofuran, N-methylpyrrolidone, dimethylformaldehyde, dimethylsulfoxide, alcohols such as isopropyl alcohol or a mixture thereof. In addition, the titanium precursor that may be used herein include, but is not limited to any one selected from titanium-(n)butoxide, titanium-(n)ethoxide, titanium-(n)isopropoxide, titanium-(n) propoxide and $TiCl_4$.

Then, 1-4 parts by weight of hydrochloric acid and 1-4 parts by weight of water are mixed with the titanium precursor based on 1 part by weight of titanium precursor, and the resultant mixture is agitated under a high speed to carry out condensation, thereby providing a sol solution containing the titanium precursor.

According to the present disclosure, hydrochloric acid is added to control the rate of condensation between the support solution and the titanium precursor. Particularly, hydrochloric acid controls the rate of rapid hydrolysis and polycondensation of titanium precursor. In other words, very strong acidity of hydrochloric acid caused by protons ($H^+$) thereof inhibits rapid hydrolysis and polycondensation of titanium precursor, thereby preventing agglomeration of titanium particles and controlling the dispersibility and viscosity.

The polymer-grafted alumina composite support solution and the solution obtained by subjecting the titanium precursor to hydrolysis and polycondensation at a low pH are mixed with each other, and the resultant mixed solution is subjected to drop casting onto a transparent conductive substrate. Then, heat treatment is carried out to remove the polymer and other residues and to improve crystallinity of titanium dioxide.

The polymer-grafted hybrid alumina composite includes a polymer having the characteristics of a hydrophilic portion and facilitates binding of titanium particles in the sol-gel reaction. Then, it is possible to obtain an alumina/titanium dioxide composite having a uniform structure by removing the polymer and other residues through heat treatment.

After that, the composite thin film is dipped into an acid or base solution at 20-80° C. for 1-24 hours in order to form a titanium dioxide thin film having a mesoporous structure by removing alumina selectively.

The mesoporous titanium dioxide thin film obtained by the method has a uniform mesoporous surface structure, large surface area and high mechanical strength. Therefore, when using the titanium dioxide thin film as a photoelectrode of a dye-sensitized solar cell, dye adsorption is improved and efficient infiltration of electrolyte is realized, thereby increasing photoelectric conversion efficiency.

MODE FOR INVENTION

Hereinafter, the present disclosure will be explained in more detail with reference to preferred exemplary embodiments. However, it will be understood by those skilled in the art that the exemplary embodiments are for illustrative purposes only, the scope of the present disclosure is not limited thereto, and various changes in form and details may be made thereto without departing from the spirit and scope of the present disclosure.

Example 1

Preparation of Mesoporous Titanium Dioxide Thin Film According to the Present Disclosure (1) Step of Preparing Alumina Chloride: Step 1 of Forming Polymer-Grafted Hybrid Alumina Composite To 250 ml round-bottom flask at 0° C., 10 ml of methylene dichloride containing 0.92 g of 4-dimethylaminopyridine dissolved therein and 0.7 ml of triethylamine are introduced. Then, 10 ml of methylene dichloride containing 1.2 ml of 2-chloropropionyl chloride dissolved therein is further added thereto, followed by agitation. To the solution subjected to agitation, 50 ml of methylene dichloride containing 5 g of alumina dissolved therein is added dropwise. Next, purging is carried out with nitrogen gas for 20 minutes to remove undesired gases. After the completion of nitrogen purging, the resultant solution is agitated at room temperature for 18 hours. After the completion of reaction, the solution is precipitated with methanol and subjected to filtration to remove unreacted materials. Finally, the resultant product is dried in a hood for 1 day and in a vacuum oven for 1 day to obtain alumina chloride.

(2) Step of Polymer (POEM) Grafting: Step 2 of Forming Polymer-Grafted Hybrid Alumina Composite To a 100 ml round-bottom flask, 5 ml of dimethyl sulfoxide containing 2 ml of polyethylene glycol methyl ether methacrylate (POEM) dissolved therein is introduced. Then, 0.0132 g of kappa-chloride, 0.036 ml of 1,1,4,7,10,10-hexamethyltriethylenetetramine and 1 g of the alumina chloride obtained as described above are further added thereto. Next, purging is carried out with nitrogen gas for 20 minutes to remove undesired gases. After the completion of nitrogen purging, the resultant solution is agitated in an oil bath at 90° C. for 24 hours. After the completion of reaction, the solution is precipitated with methanol and subjected to filtration to remove unreacted materials. Finally, the resultant product is dried in a hood for 1 day and in a vacuum oven for 1 day to obtain a polymer-grafted hybrid alumina composite.

(3) Step of Forming Titanium Dioxide Sol Solution

To a 30 ml vial equipped with a lid, 5 parts by weight of the polymer-grafted alumina composite is dispersed into 100 parts by weight of isopropyl alcohol for at least 2 hours. Once a well-dispersed solution is formed, 11.3 parts by weight of hydrochloric acid and 11.3 parts by weight of water are added dropwise to 16 parts by weight of titanium tetraisopropoxide agitated vigorously in another vial, followed by agitation for 15 minutes.

The precursor solution is added dropwise to the polymer-grafted alumina composition solution, and agitated for 3 hours to obtain a gold-colored sol-like solution.

(4) Step of Forming Alumina/Titanium Dioxide Composite

The sol solution is drop cast to an FTO (fluorine-tin oxide) glass substrate and subjected to casting by way of a doctor blade process. After carrying out aging for 5-10 hours, the resultant product is fired at 450° C. to remove the polymer material and other residues contained in the support and to improve the crystallinity. In this manner, an alumina/titanium dioxide composite is obtained by using the polymer-grafted alumina as a support for sol-gel reaction.

(5) Step of Forming Titanium Dioxide Thin Film Layer

The alumina/titanium dioxide composite obtained as described above is dipped into an aqueous basic NaOH (10 wt %) solution at 50° C. for 24 hours to form a mesoporous titanium dioxide thin film through the selective removal of alumina.

Example 2

Production of Dye-Sensitized Solar Cell Using the Mesoporous Titanium Dioxide Thin Film According to the Present Disclosure In a photoelectrode on which the titanium dioxide thin film layer obtained as described above is formed, a ruthenium-based dye is adsorbed onto the upper titanium dioxide. To carry out the dye adsorption, the photoelectrode is immersed into a solution containing a dye at room temperature for at least 24 hours, or at 50° C. for at least 2 hours.

Then, the titanium dioxide photoelectrode onto which the dye is adsorbed is washed with an alcohol solvent to remove dye residues, followed by drying in a vacuum oven at 50° C. After an electrolyte solution is cast onto the dried photoelectrode layer, the photoelectrode is assembled with a counter electrode, and the electrolyte layer is caused to adhere strongly to the surfaces of the two electrodes under pressure.

Test Example 1

Structure of Mesoporous Titanium Dioxide Thin Film

The mesoporous titanium dioxide thin film obtained by using the polymer-grafted hybrid alumina composite as a support for titanium dioxide sol-gel reaction according to the present disclosure is examined by FE-SEM (Field Emission Scanning Electron Microscopy).

Figure 2:
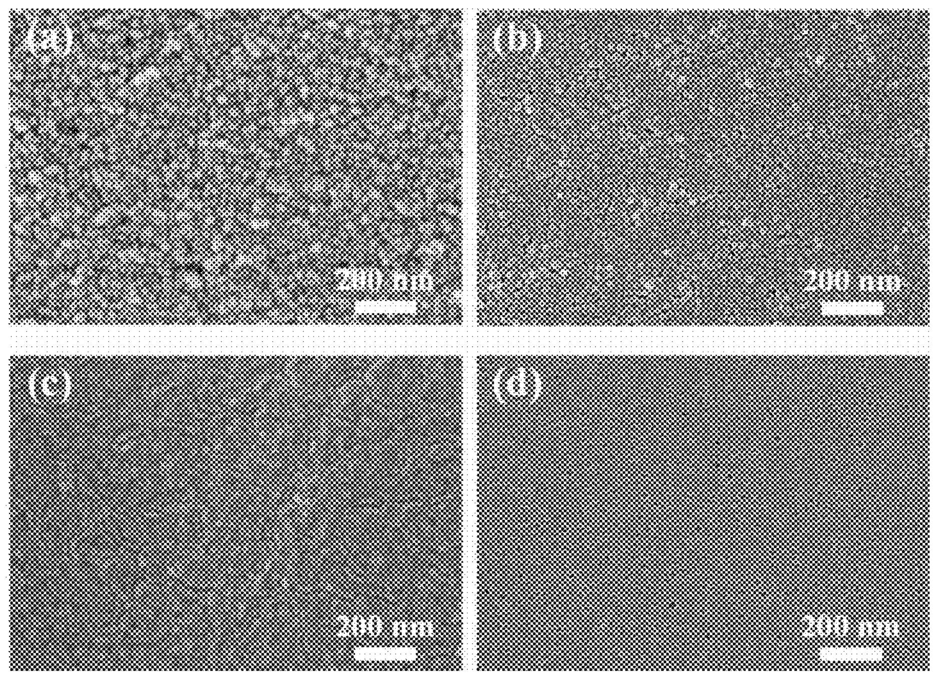
FIG. 2 shows FE-SEM (Field Emission Scanning Electron Microscopy) images illustrating (a) alumina nanoparticles (15 nm), (b) a polymer-grafted hybrid alumina support, (c) an alumina/titanium composite after the sol-gel reaction using the support, and (d) the surface of a mesoporous titanium dioxide thin film obtained by selective removal of alumina.

(1) As shown in FIG. 2, it can be seen that (a) the alumina nanoparticles have a size of about 15 nm. It can be also seen through the image of the polymer-grafted hybrid alumina composite that (b) the alumina nanoparticles serve as cores, the polymer surrounds the cores, and mesopores are interconnected with each other. In addition, it can be seen that (c) after the titanium dioxide/alumina composite is subjected to sol-gel reaction and sintering, the polymer grafted to the surrounding of alumina serves to facilitate sol-gel reaction so that the alumina inorganic nanoparticles are surrounded with the titanium dioxide inorganic nanoparticles produced by the sol-gel reaction. Further, it can be seen that (d) a mesoporous titanium dioxide thin film structure is provided after removing the alumina nanoparticles selectively through the use of a strongly acidic or basic material.

Figure 3:
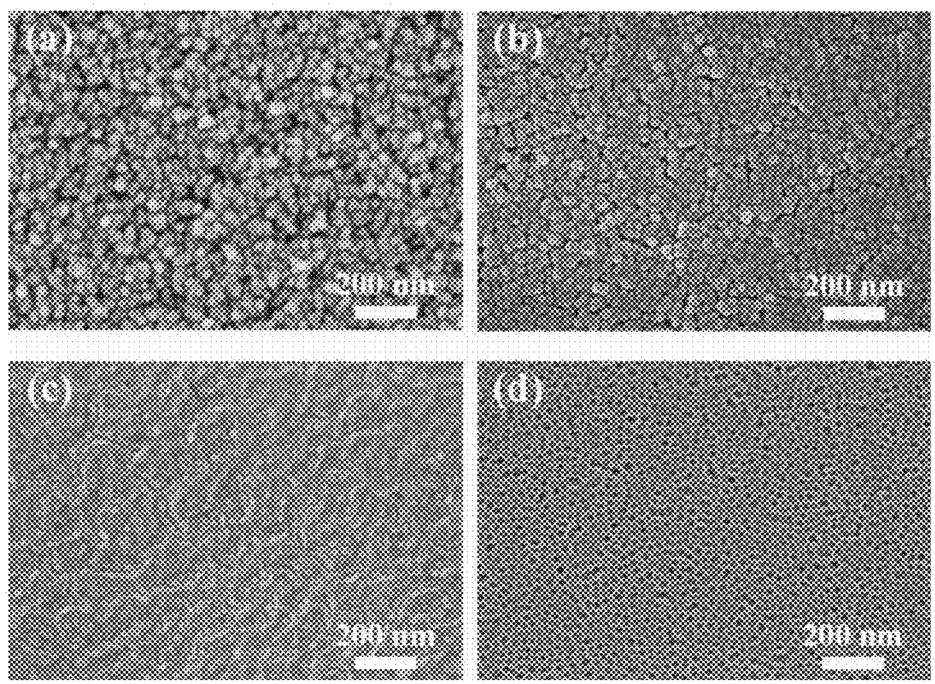
FIG. 3 shows FE-SEM images illustrating (a) alumina nanoparticles (50 nm), (b) a polymer-grafted hybrid alumina support, (c) an alumina/titanium composite after the sol-gel reaction using the support, and (d) the surface of a mesoporous titanium dioxide thin film obtained by selective removal of alumina.

(2) FIG. 3 is an FE-SEM image illustrating a mesoporous titanium dioxide thin film obtained by using alumina nanoparticles having a size controlled to 50 nm as a starting material. As compared with FIG. 2, after removing alumina selectively, it can be seen that the mesopores of titanium dioxide have a size of about 50 nm (FIG. 3(*d*)). Therefore, it can be seen from the foregoing that it is possible to control the size of mesopores of titanium dioxide by controlling the size of alumina nanoparticles as a starting material.

Figure 4:
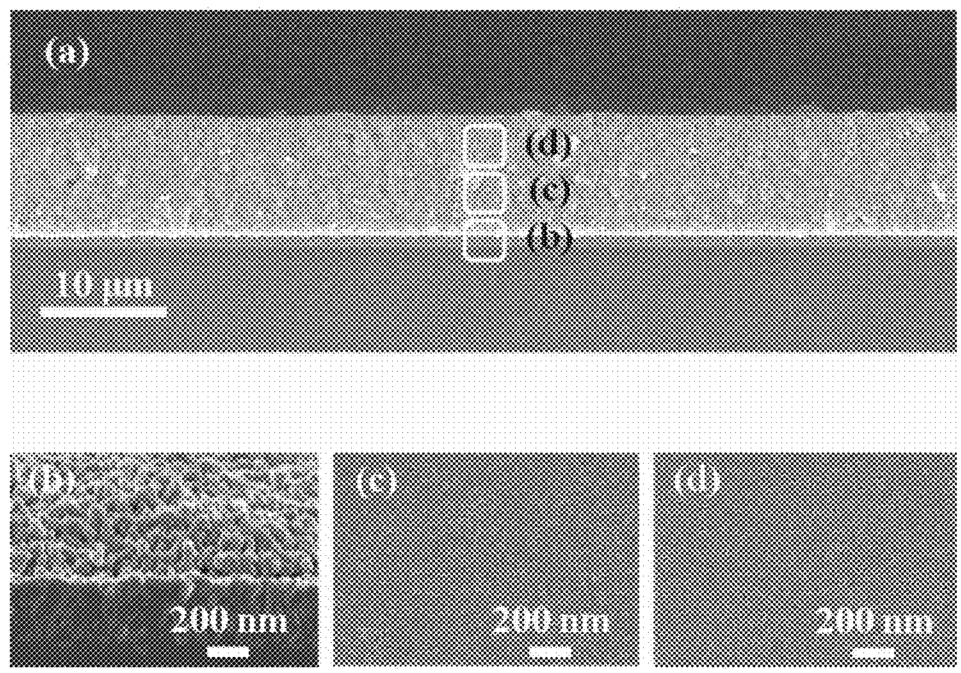
FIG. 4 shows FE-SEM images illustrating the lateral surface of a mesoporous titanium dioxide thin film using alumina nanoparticles having a size of 15 nm.
Figure 5:
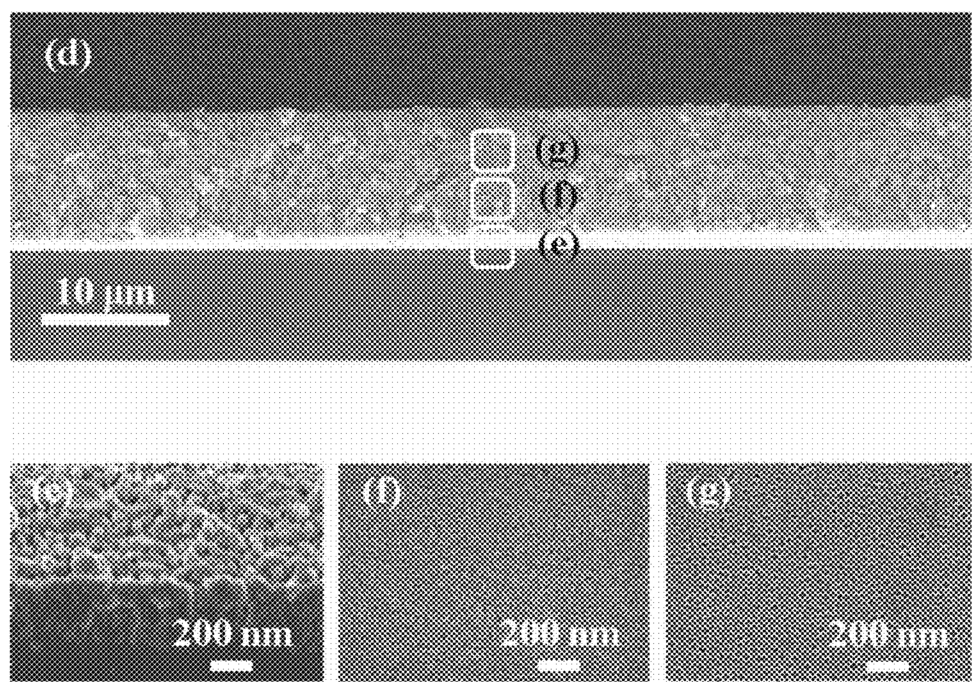
FIG. 5 shows FE-SEM images illustrating the lateral surface of a mesoporous titanium dioxide thin film using alumina nanoparticles having a size of 50 nm.

(3) It can be also seen through the lateral side FE-SEM images (FIG. 4 and FIG. 5) that a mesoporous titanium dioxide thin film is obtained by using a polymer-grafted hybrid alumina support. When using two types of alumina nanoparticles each having a size of 15 nm and 50 nm, each thin film has a thickness of 10 μm. Further, it can be seen through the enlarged image that the titanium dioxide structure has more mesoporous structures from the lower part toward the upper part.

It is thought that this results from a difference in density between alumina nanoparticles (3.95-4.1 g/cm$^3$) and titanium dioxide (4.23 g/cm$^3$) during the sol-gel reaction. In other words, it is likely that alumina nanoparticles having a lower density are distributed more at the upper part rather than the lower part. Thus, since the contact portion with a transparent conductive substrate is not mesoporous titanium dioxide but agglomerated titanium, the mesoporous titanium dioxide thin film contributes to improvement of the mechanical strength of a dye-sensitized solar cell.

Figure 6:
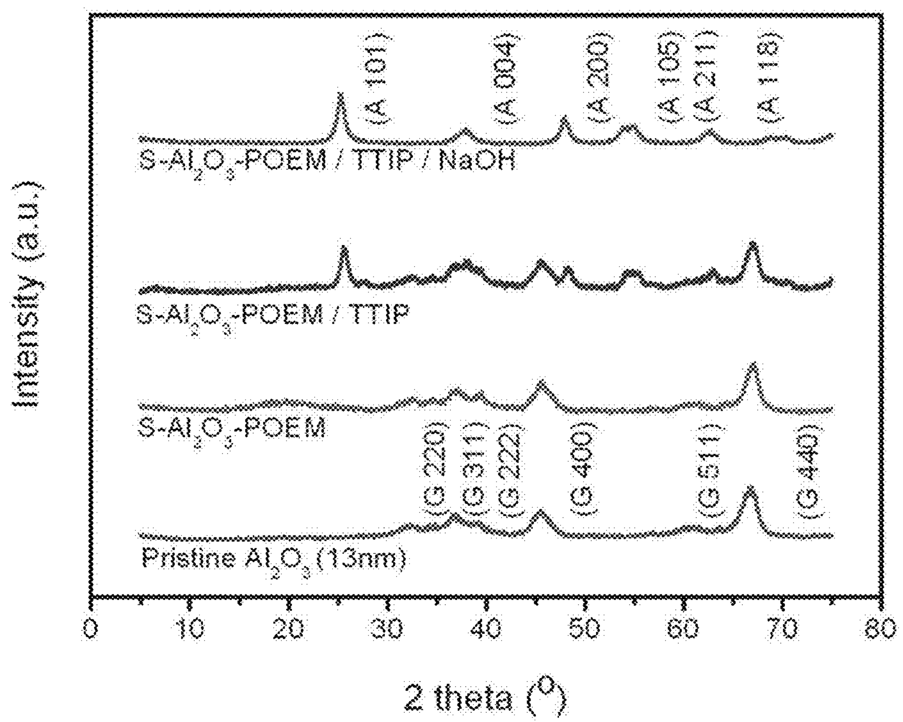
FIG. 6 shows XRD (X-Ray Diffraction) analysis results of alumina nanoparticles (15 nm), a polymer-grafted hybrid alumina support, an alumina/titanium composite after the sol-gel reaction using the support, and a mesoporous titanium dioxide thin film obtained by selective removal of alumina.
Figure 7:
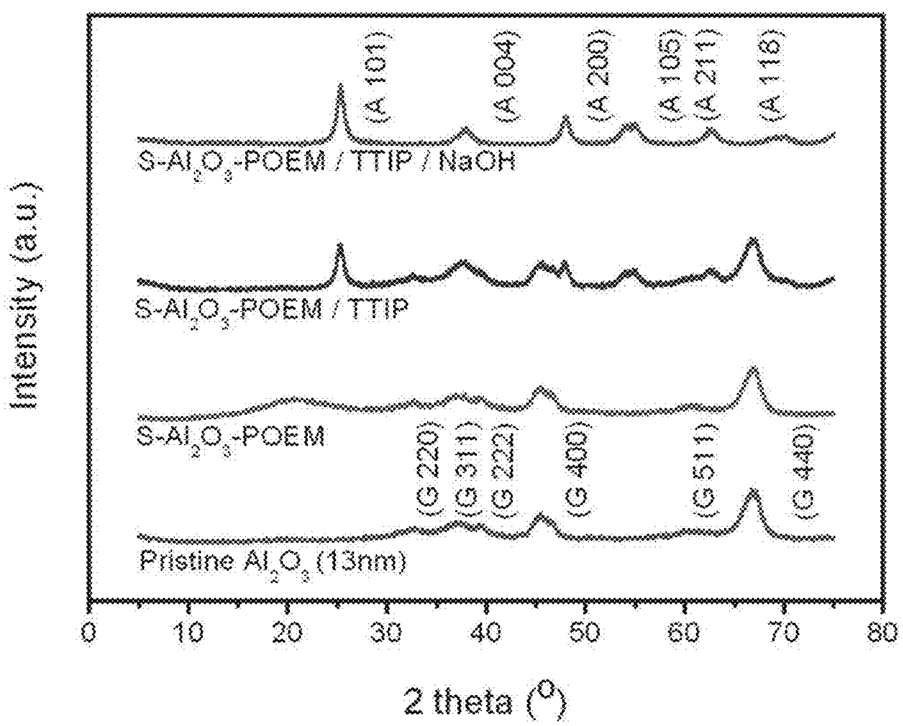
FIG. 7 shows XRD analysis results of alumina nanoparticles (50 nm), a polymer-grafted hybrid alumina support, an alumina/titanium composite after the sol-gel reaction using the support, and a mesoporous titanium dioxide thin film obtained by selective removal of alumina.

(4) Phase changes in preparing mesoporous titanium dioxide using a polymer-grafted hybrid alumina composite are examined through the XRD analysis (FIG. 6 and FIG. 7). When using alumina nanoparticles having a size of 15 nm as a starting material (FIG. 6), it can be seen that alumina is formed of a gamma phase. It can be also seen that the support is prepared sufficiently through the round peak around about 20° that appears freshly after polymer grafting. Then, after the sol-gel reaction of titanium dioxide using the polymer-grafted hybrid alumina as a support, a new sharp peak can be seen, which suggests formation of anatase-phase titanium dioxide. Finally, after removing alumina selectively by using a basic material, it can be seen that only anatase-phase titanium dioxide remains through the XRD analysis. In addition, use of alumina nanoparticles having a size of 50 nm as a starting material provides results similar to the above results (FIG. 7).

(5) After observing the surface and lateral surface of a titanium dioxide thin film obtained by using the polymer-grafted hybrid alumina composite as a support for sol-gel reaction, it can be seen that a mesoporous structure having a high specific surface area is formed.

Figure 8:
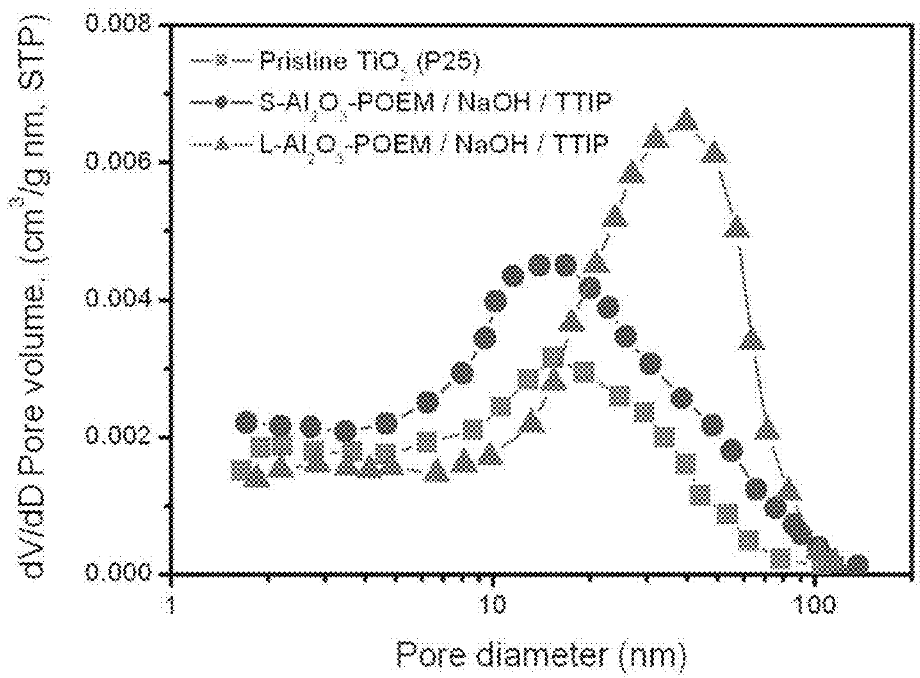
FIG. 8 is a graph showing the surface characteristics (pore size distribution based on BJH (Barrett-Joyner-Halenda) measurement) of a commercially available titanium dioxide (P25, control) and titanium dioxide obtained by using polymer-grafted hybrid alumina (15, 50 nm) as a support for sol-gel reaction.

Particularly, after determining specific surface area by using a BET method, commercially available titanium dioxide (P25) provides a specific surface area of 56.1 m$^2$/g, the titanium dioxide thin film obtained by using alumina nanoparticles having a size of 15 nm as a support for sol-gel reaction provides a specific surface area of 90.1 m$^2$/g, and the titanium dioxide thin film obtained by using alumina nanoparticles having a size of 50 nm as a support for sol-gel reaction provides a specific surface area of 79.7 m$^2$/g. In addition, after determining the porosity by using BJH analysis (FIG. 8), it can be seen that the titanium dioxide thin film obtained by using the polymer-grafted hybrid alumina as a support for sol-gel reaction has a mesoporous size and distribution, and shows a larger pore volume as compared to the commercially available titanium dioxide (P25).

Test Example 2

Figure 9:
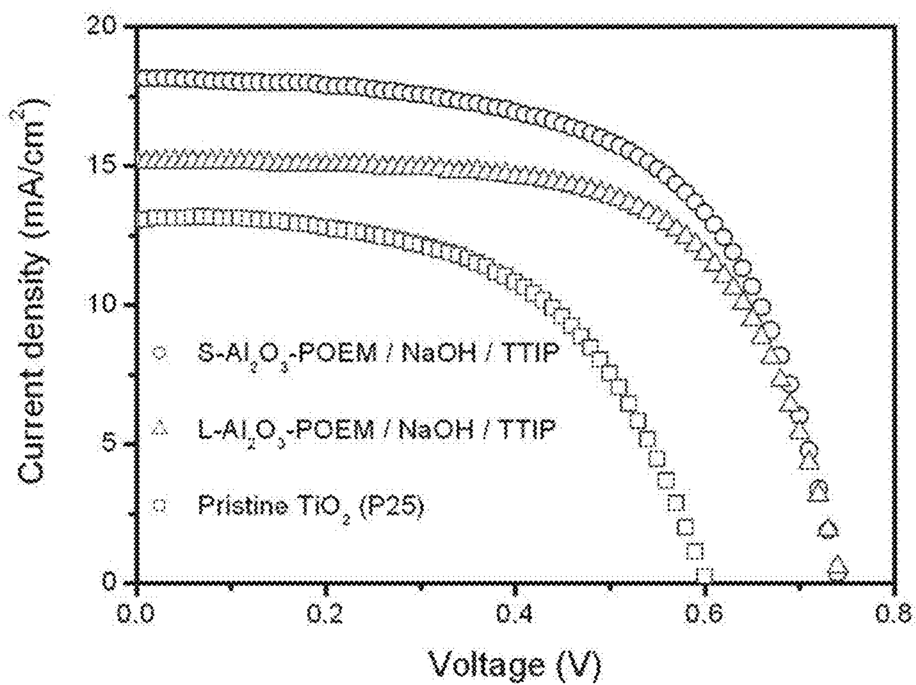
FIG. 9 is a graph illustrating the solar cell characteristics of the dye-sensitized solar cell obtained by introducing a polymerized ionic liquid electrolyte to the mesoporous titanium dioxide photoelectrode according to the present disclosure.
Figure 10:
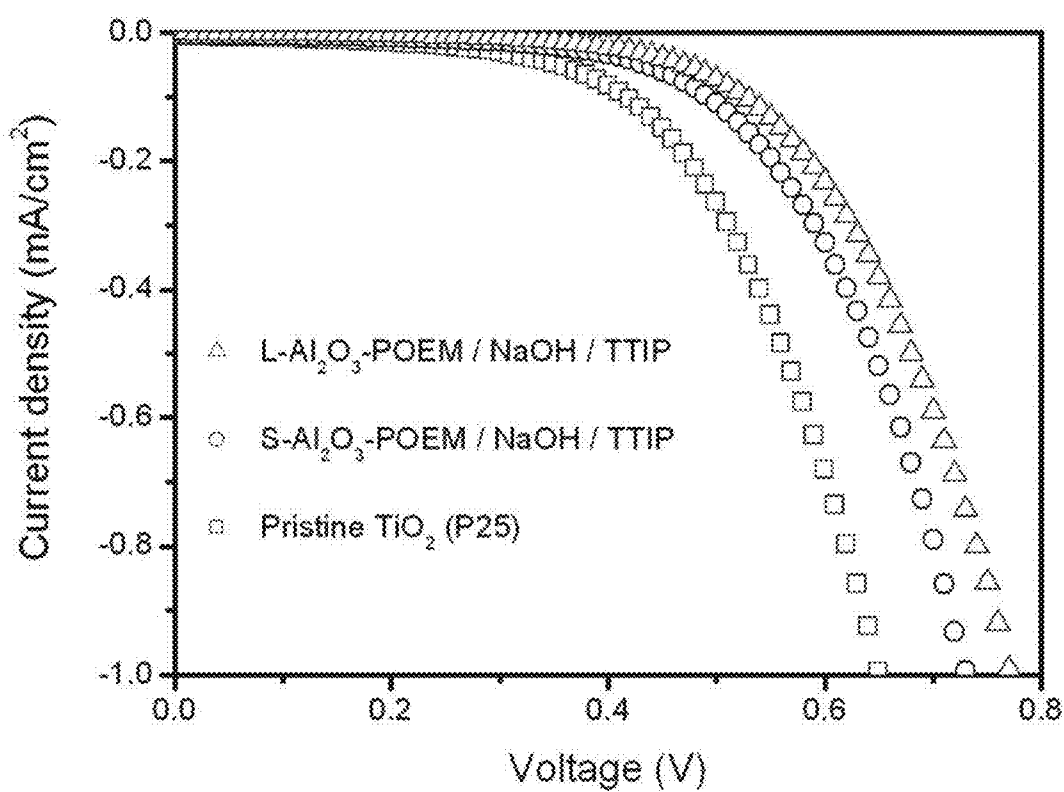
FIG. 10 is a graph illustrating the solar cell characteristics of the dye-sensitized solar cell obtained by introducing a polymerized ionic liquid electrolyte to the mesoporous titanium dioxide photoelectrode according to the present disclosure, as determined by dark current measurement.

Analysis of Efficiency of Dye-Sensitized Solar Cell Using Mesoporous Titanium Dioxide Thin Film According to the Present Disclosure as Photoelectrode When polymerized ionic liquid (Won Seok, Chi et al., Electrochemistry communications, Vol. 13, 1349, 2011) is used and alumina having a size of 13 nm is used as a starting material serving as a support for sol-gel reaction, and alumina having a size of 50 nm is used as a starting material serving as a support for sol-gel reaction (i.e., in the case of a dye-sensitized solar cell using the mesoporous titanium dioxide thin film according to the present disclosure as an electrode), photoelectric conversion efficiency is increased from 4.37% (a dye-sensitized solar cell using the commercially available titanium dioxide (P25)) to 8.20% and 7.24% by about 88% and 66%, respectively (FIG. 9). Such an increase in photoelectric conversion efficiency results from an increase in dye adsorption amount and efficient infiltration of electrolyte caused by the high-surface area mesoporous titanium dioxide. In addition, this may results from a decrease in electron recombination caused by structural characteristics of interconnected mesopores. The results of dark current analysis shown in FIG. 10 also demonstrate the above results.

The dye-sensitized solar cell according to the present disclosure is analyzed for its optical characteristics through a solar simulator. After the analysis, use of the polymer-grafted alumina composite as a support for sol-gel reaction provides high photoelectric conversion efficiency, which may result from an increase in dye adsorption amount, a decrease in electron recombination and efficient infiltration of electrolyte caused by the formation of high-surface area mesoporous titanium dioxide thin film.

INDUSTRIAL APPLICABILITY

The porous titanium dioxide thin film according to the present disclosure is obtained by using the polymer-grafted hybrid alumina composite as a support for sol-gel reaction, and thus it has a mesoporous structure and high surface area, thereby providing a high dye adsorption ratio. Therefore, a dye-sensitized solar cell using the mesoporous titanium dioxide thin film as a photoelectrode material allows efficient infiltration of high-viscosity polymer and solid electrolyte as well as liquid electrolyte, thereby providing improved long-term stability and industrial applicability.

The invention claimed is:

1. A method for producing a mesoporous titanium dioxide thin film, comprising the steps of:

(a) dispersing a polymer-grafted hybrid alumina composite into a solvent to provide a support solution;

(b) introducing a titanium precursor into an acid solution for forming a sol solution, followed by agitation, to form the sol solution, and mixing the sol solution with the support solution to provide a sol-like mixed solution;

(c) drop casting the mixed solution, followed by sintering at high temperature to form an alumina/titanium dioxide composite thin film; and (d) removing alumina selectively from the composite thin film by dipping the composite thin film into an acid or base solution for removing alumina, which contains 5-30 parts by weight of an acid or a base and 5-100 parts by weight of solvent based on 1 part by weight of the composite thin film of alumina with titanium dioxide.

2. The method for producing a mesoporous titanium dioxide thin film according to claim 1, wherein the polymer of step (a) is selected from poly(oxyethylene)methacrylate, poly (ethylene glycol) methyl ether (meth)acrylate, hydroxyethyl (meth)acrylate, hydrolyzed t-butyl (meth)acrylate, acrylamide, N-vinylpyrrolidone, aminostyrene, styrenesulfonic acid, methylpropenesulfonic acid, sulfopropyl (meth)acrylate, sulfoethyl (meth)acrylate and sulfobutyl (meth)acrylate.

3. The method for producing a mesoporous titanium dioxide thin film according to claim 1, wherein the composite of step (a) has a weight ratio of 1:0.3-5 of alumina:polymer.

4. The method for producing a mesoporous titanium dioxide thin film according to claim 1, wherein the solvent of step (a) is selected from tetrahydrofuran, N-methylpyrrolidone, dimethyl formaldehyde, dimethylsufoxide, alcohols and mixtures thereof.

5. The method for producing a mesoporous titanium dioxide thin film according to claim 1, wherein the titanium precursor of step (b) is selected from titanium-(n)butoxide, titanium-(n)ethoxide, titanium-(n)isopropoxide, titanium-(n) propoxide and TiCl4.

6. The method for producing a mesoporous titanium dioxide thin film according to claim 1, wherein the acidic solution of step (b) is a mixture of water with hydrochloric acid containing 1-4 parts by weight of hydrochloric acid and 1-4 parts by weight of water based on 1 part by weight of the titanium precursor.

7. The method for producing a mesoporous titanium dioxide thin film according to claim 1, wherein the support solution and the sol solution containing the titanium precursor have a molar ratio of 1:1-10, in step (b).

8. The method for producing a mesoporous titanium dioxide thin film according to claim 1, wherein the acid for removing alumina is at least one selected from hydrochloric acid (HCl), hydrobromic acid (HBr), hydroiodic acid (HI), hypochlorous acid (HClO), chlorous acid (HClO2), chloric acid (HClO3), perchloric acid (HClO4), sulfuric acid (H2SO4), fluorosulfuric acid (HSO3F), nitric acid (HNO3), phosphoric acid (H3PO4), fluoroantimonic acid (HSbF6), fluoroboric acid (HBF4), hexafluorophosphoric acid (HPF6), chromic acid (H2CrO4) and boric acid (H3BO3).

9. The method for producing a mesoporous titanium dioxide thin film according to claim 1, wherein the base for removing alumina is at least one selected from the group consisting of potassium hydroxide (KOH), barium hydroxide (Ba(OH) 2), cesium hydroxide (CsOH), sodium hydroxide (NaOH), strontium hydroxide (Sr(OH)2), calcium hydroxide (Ca(OH) 2), magnesium hydroxide (Mg(OH)2), lithium hydroxide (LiOH) and rubidium hydroxide (RbOH).

10. The method for producing a mesoporous titanium dioxide thin film according to claim 1, wherein the solvent is selected from the group consisting of tetrahydrofuran, N-methylpyrrolidone, dimethylformaldehyde, dimethyl sulfoxide, alcohols and mixtures thereof.

11. The method for producing a mesoporous titanium dioxide thin film according to claim 1, wherein step (c) is carried out by sintering at 400-500° C. for 1-3 hours.

12. The method for producing a mesoporous titanium dioxide thin film according to claim 1, wherein the dipping is conducted at 20-80° C. for 1-24 hours.

* * * * *